(12) United States Patent
Lerdworatawee et al.

(10) Patent No.: US 9,685,864 B2
(45) Date of Patent: Jun. 20, 2017

(54) SWITCHING REGULATOR CIRCUITS AND METHODS WITH RECONFIGURABLE INDUCTANCE

(71) Applicant: QUALCOMM Incorporated, San Diego, CA (US)

(72) Inventors: Jongrit Lerdworatawee, Santee, CA (US); Chunlei Shi, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 14/675,354

(22) Filed: Mar. 31, 2015

(65) Prior Publication Data

US 2016/0294284 A1  Oct. 6, 2016

(51) Int. Cl.
*H02M 3/158* (2006.01)
*H03F 1/02* (2006.01)
(Continued)

(52) U.S. Cl.
CPC .......... *H02M 3/158* (2013.01); *H02M 3/155* (2013.01); *H03F 1/0227* (2013.01);
(Continued)

(58) Field of Classification Search
None
See application file for complete search history.

(56) References Cited

U.S. PATENT DOCUMENTS

| 2005/0040800 A1* | 2/2005 | Sutardja ................ H02M 3/157 323/283 |
| 2008/0003950 A1 | 1/2008 | Haapoja et al. |

(Continued)

FOREIGN PATENT DOCUMENTS

| JP | 2005137172 A | 5/2005 |
| JP | 2010178608 A | 8/2010 |

OTHER PUBLICATIONS

Hsia, C., et al., "Wideband high efficiency digitally-assisted envelope amplifier with dual switching stages for radio base-station envelope tracking power amplifiers," Proc. IEEE MTT-S, May 2010, pp. 672-675.
(Continued)

*Primary Examiner* — Fred E Finch, III
*Assistant Examiner* — Yusef Ahmed
(74) *Attorney, Agent, or Firm* — Haynes and Boone, LLP

(57) ABSTRACT

The present disclosure includes circuits that have a switching regulator and methods of operating the circuits. The switching regulator may receive a switching signal that has a switching frequency. The circuit also includes a monitor circuit to monitor the switching frequency, and includes a reconfigurable inductance coupled to an output of the switching regulator. The monitor circuit may change the reconfigurable inductance. The circuit includes an amplifier to receive an envelope tracking signal. An output of the amplifier is coupled to the output of the switching regulator to provide a power supply voltage. The circuit may further include a switching generator circuit to produce the switching signal for the switching regulator based on an output current of the amplifier. The monitor circuit may compare a frequency of the envelope tracking signal to the switching frequency of the switching signal and accordingly change the reconfigurable inductance.

17 Claims, 7 Drawing Sheets

(51) Int. Cl.
    *H02M 3/155* (2006.01)
    *H03F 3/217* (2006.01)
    *H02M 1/00* (2006.01)

(52) U.S. Cl.
    CPC ... *H03F 3/2173* (2013.01); *H02M 2001/0045* (2013.01); *H02M 2001/0064* (2013.01); *H03F 2200/432* (2013.01)

(56) References Cited

U.S. PATENT DOCUMENTS

| | | | |
|---|---|---|---|
| 2008/0067988 A1* | 3/2008 | Yabuzaki | H02M 3/158 323/271 |
| 2009/0302820 A1* | 12/2009 | Shimizu | H02M 3/156 323/285 |
| 2009/0322303 A1* | 12/2009 | Hirata | H02M 3/156 323/284 |
| 2010/0295521 A1 | 11/2010 | Odaohhara | |
| 2011/0109387 A1* | 5/2011 | Lee | H03F 1/0227 330/251 |
| 2011/0241630 A1* | 10/2011 | Ritchey | H02P 9/02 322/23 |
| 2011/0285369 A1* | 11/2011 | Cuk | H02M 3/158 323/282 |
| 2011/0316502 A1* | 12/2011 | Tang | H02M 3/156 323/271 |
| 2012/0112719 A1* | 5/2012 | Xia | H02M 1/143 323/282 |
| 2012/0242308 A1* | 9/2012 | Adeeb | H02M 1/32 323/274 |
| 2012/0243267 A1* | 9/2012 | Kassayan | H02M 3/33569 363/21.12 |
| 2012/0286889 A1* | 11/2012 | Park | H03B 5/1212 331/117 FE |
| 2013/0069737 A1* | 3/2013 | See | H04B 1/18 333/32 |
| 2013/0141063 A1* | 6/2013 | Kay | G05F 1/468 323/271 |
| 2013/0141064 A1* | 6/2013 | Kay | G05F 1/46 323/271 |
| 2013/0141169 A1 | 6/2013 | Khlat et al. | |
| 2013/0188397 A1* | 7/2013 | Wu | H02M 3/33576 363/17 |
| 2013/0207627 A1* | 8/2013 | Kahn | G05F 1/46 323/271 |
| 2014/0006808 A1 | 1/2014 | Sizikov et al. | |
| 2014/0062590 A1 | 3/2014 | Khlat et al. | |
| 2014/0218109 A1* | 8/2014 | Wimpenny | H03F 3/217 330/251 |
| 2014/0240052 A1 | 8/2014 | Mao | |
| 2014/0368174 A1* | 12/2014 | Houston | H02M 3/158 323/271 |
| 2014/0375288 A1* | 12/2014 | Nora | H02M 3/1584 323/272 |
| 2015/0061632 A1* | 3/2015 | Philbrick | H02M 3/158 323/290 |
| 2015/0109824 A1* | 4/2015 | Chen | H02M 3/22 363/17 |
| 2015/0180426 A1* | 6/2015 | Kingsley | H03F 1/565 330/277 |
| 2015/0263625 A1* | 9/2015 | Lee | H02M 3/158 323/271 |
| 2015/0364996 A1* | 12/2015 | Mansri | H02M 3/158 323/271 |
| 2016/0111061 A1* | 4/2016 | Thenus | H02M 3/1584 345/173 |

OTHER PUBLICATIONS

Kim, D., et al., "Highly efficient dual-switch hybrid switching supply modulator for envelope tracking power amplifier," IEEE microwave and wireless components letters, Jun. 6, 2012, pp. 285-287, vol. 22, No. 6.

International Search Report and Written Opinion—PCT/US2016/021211—ISA/EPO—May 24, 2016.

* cited by examiner

SWITCHING REGULATOR CIRCUITS AND METHODS WITH RECONFIGURABLE INDUCTANCE

BACKGROUND

The present disclosure relates to electronic circuits and methods, and in particular, to switching regulator circuits and methods having reconfigurable inductance.

Switching regulators are circuits that produce regulated voltages or currents by switching passive elements in to and out of different electrical configurations. FIG. 1 illustrates an example of one switching regulator topology. In this example switching regulator, switches 101 and 102 are turned on and off so that an input voltage, Vdd, charges an inductor (L) 103. When switch 101 is closed and switch 102 is open, energy is provided to the inductor 103 from Vdd to generate an inductor current IL. Switch 102 is periodically closed and switch 101 is opened, and the inductor current IL continues to flow to an output, "out", as energy in the inductor dissipates. Switches 101 and 102 are controlled by a switch control circuit 104, and the ON/OFF time of each switch may vary according to a number of different application requirements. Switching regulators are very efficient circuits for providing voltages and currents, but suffer from a number of problems in certain applications.

For example, one challenge with switching regulators is noise generated by the switches as they are turned ON and OFF. This is referred to as switching noise. The switching noise can be effectively suppressed with the use of a larger inductor. However, using a larger inductor has a drawback of degrading the efficiency, especially if the voltage on the output is changing. It is very difficult to select a single inductor that achieves the best trades off between the noise and efficiency performance over a wide bandwidth range, for example.

One particular application where switching regulators are employed is in envelope tracking in a power amplifier application. Achieving high efficiency in a linear power amplifier is challenging, particularly in wireless applications where modulation schemes have become more complicated and their peak to average power ratio increases. Envelope Tracking (ET) is an approach to boost the efficiency of a PA by continuously adjusting its power supply voltage to improve efficiency during transmission.

FIG. 2 shows an example configuration for one type of envelope tracking system. In this example, an input signal Vin is provided at the input of a power amplifier (PA) 203 to produce a power amplified signal Vout. PA 203 receives a power supply voltage Vdd and a power supply current Idd from a configuration of a linear amplifier 201 and a switching stage 202. The linear and switching stages work together to adjust the level of Vdd based on the envelope of the power amplifier input signal Vin to improve the efficiency of the power amplifier 203. In this example, linear amplifier 201 receives an envelope tracking signals (ET) representing the envelope of Vin, for example. Linear amplifier 201 may produce a voltage Vdd and current Iamp. Switching stage 202 receives a switching signal SW based on the envelope signal. In this example, SW is generated by sensing Iamp. Switching stage 202 produces a voltage Vdd and current Isw. The sum of currents Iamp and Isw are the power supply current Idd drawn by PA 203. The switching regulator stage 202 boosts the ET's efficiency but it is noisy. The linear regulator stage 201 is higher speed and ensures the optimum power supply voltage to achieve PA's peak efficiency, but it is (power) loss. Unfortunately, the noise and efficiency are the contradictory performance requirements.

Envelope tracking effectively improves the efficiency of the PA in the RF transmitter path while inevitably introducing a switching noise, which may fall into the RF receiver band and hence degrades the receiver sensitivity. The frequency content of the switching noise is sometimes coherent with the transmitter band profile, making it difficult to implement a filter to effectively remove the noise. As mentioned above, the switching noise can be effectively suppressed with the use of larger inductor, but with reduced efficiency.

For many existing envelope tracking systems, a choice of the inductor is made to balance the noise and efficiency performance. However, a particular choice of inductor cannot meet the wide range of the envelope bandwidth requirement.

SUMMARY

The present disclosure includes switching regulator circuits and methods having reconfigurable inductance. In one embodiment, a circuit comprises a switching regulator, the switching regulator receiving a switching signal having a switching frequency, a monitor circuit to monitor the switching frequency, and a reconfigurable inductance at an output of the switching regulator, wherein the monitor circuit changes the reconfigurable inductance between a plurality of inductance values based on the switching frequency. In envelope tracking applications, an envelope tracking signal frequency and switching frequency are monitored to adjust a switching stage inductance.

The following detailed description and accompanying drawings provide a better understanding of the nature and advantages of the present disclosure.

DETAILED DESCRIPTION

The present disclosure pertains to switching regulator circuits and methods having reconfigurable inductance. In the following description, for purposes of explanation, numerous examples and specific details are set forth in order to provide a thorough understanding of the present disclosure. It will be evident, however, to one skilled in the art that the present disclosure as expressed in the claims may include some or all of the features in these examples alone or in combination with other features described below, and may further include modifications and equivalents of the features and concepts described herein.

Figure 1:
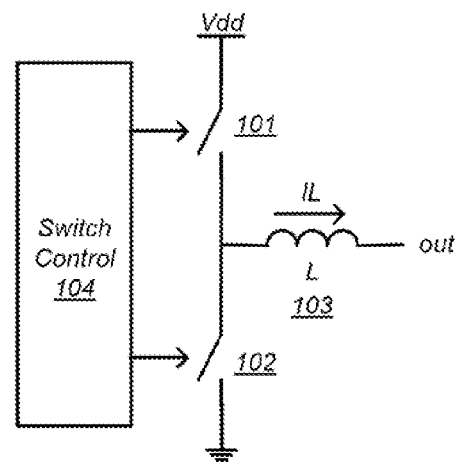
FIG. 1 illustrates an example of one switching regulator topology.
Figure 2:
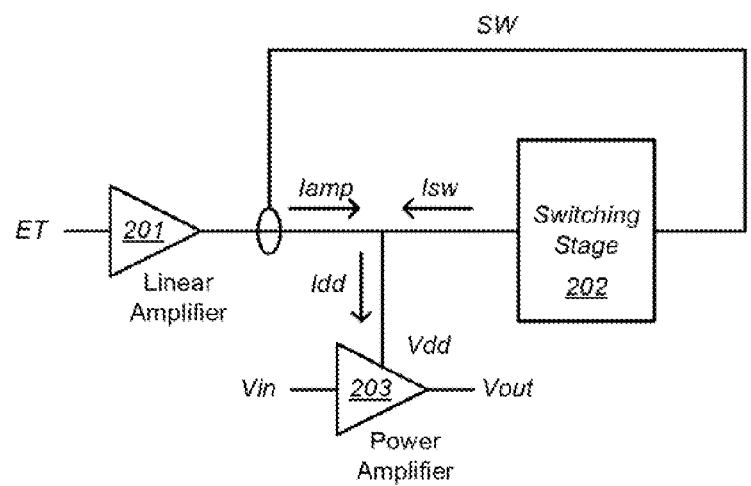
FIG. 2 shows an example configuration for one type of envelope tracking system.
Figure 3A:
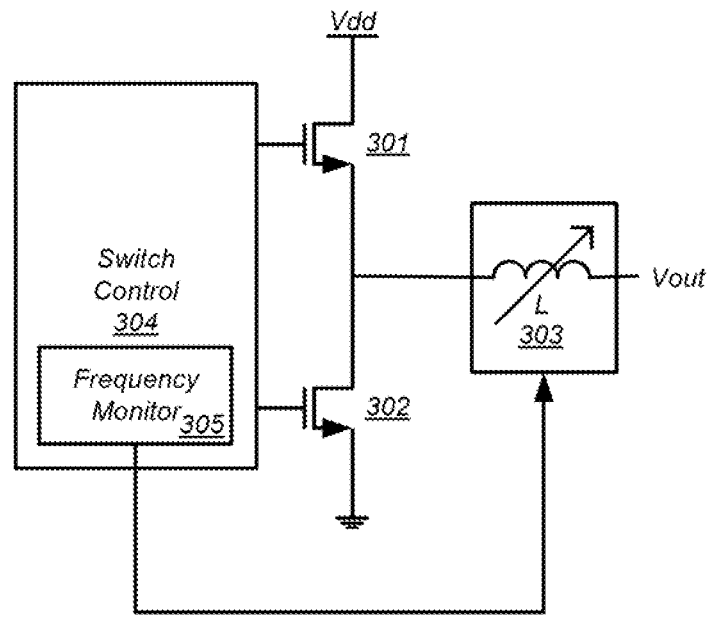
FIG. 3A illustrates a switching regulator circuit according to one embodiment.

FIG. 3A illustrates a switching regulator circuit according to one embodiment. In one embodiment, a switching regulator includes a first switch 301 and a second switch 302 that are turned ON and OFF by a switch control circuit 304. The switching regulator includes a switching signal having a switching frequency for turning switches 301 and 302 ON and OFF (e.g., at a particular duty cycle). In this example, the switches 301 and 302 are MOS transistors. However, it is to be understood that a variety of other suitable switch technologies could be used. Features and advantages of the present disclosure include a monitor circuit 305 to monitor the switching frequency of the switching regulator. The circuit further includes a reconfigurable inductance 303 at an output of the switching regulator. The monitor circuit 305 is coupled to the reconfigurable inductance 303 and produce signals (e.g., logic signals) to change the reconfigurable inductance 303 between a plurality of inductance values based on the switching frequency to optimize the performance of the system. For example, in some embodiments the inductance is reduced as the switching frequency increases. In a particular example, the reconfigurable inductance 303 may comprise a plurality of inductors and a plurality of switches. The switches may be opened and closed to change the configuration of the inductors at the output of the switching regulator, and improve the performance of the system. For example, in some applications it may be desirable to have a larger inductance at low frequencies and a smaller inductance at higher frequencies. Accordingly, in one embodiment, when the switching frequency is a first frequency, the reconfigurable inductance has a first inductance value, and when the switching frequency is a second frequency greater than the first frequency, the reconfigurable inductance has a second inductance value less than the first inductance value. As another example, the inductance may change by arranging inductors in different configurations. For example, in a first configuration, the reconfigurable inductance 303 may comprise a plurality of inductors in parallel, and in a second configuration, the reconfigurable inductance 303 may comprise a plurality of inductors in series. Further examples and advantages of the present disclosure are described in more detail below.

Figure 3B:
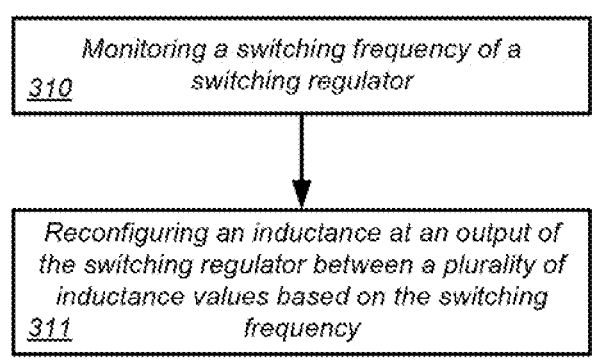
FIG. 3B illustrates a method according to an embodiment.

FIG. 3B illustrates a method according to an embodiment. At 310, a system may monitor a switching frequency of a switching regulator. At 311, an inductance at an output of the switching regulator is reconfigured between a plurality of inductance values based on the switching frequency. In one embodiment, reconfiguring the inductance comprises alternately changing the inductance between a plurality of discrete inductance values to produce an average inductance. Further example inductor arrangements and control techniques are described in more detail below.

Figure 4A:
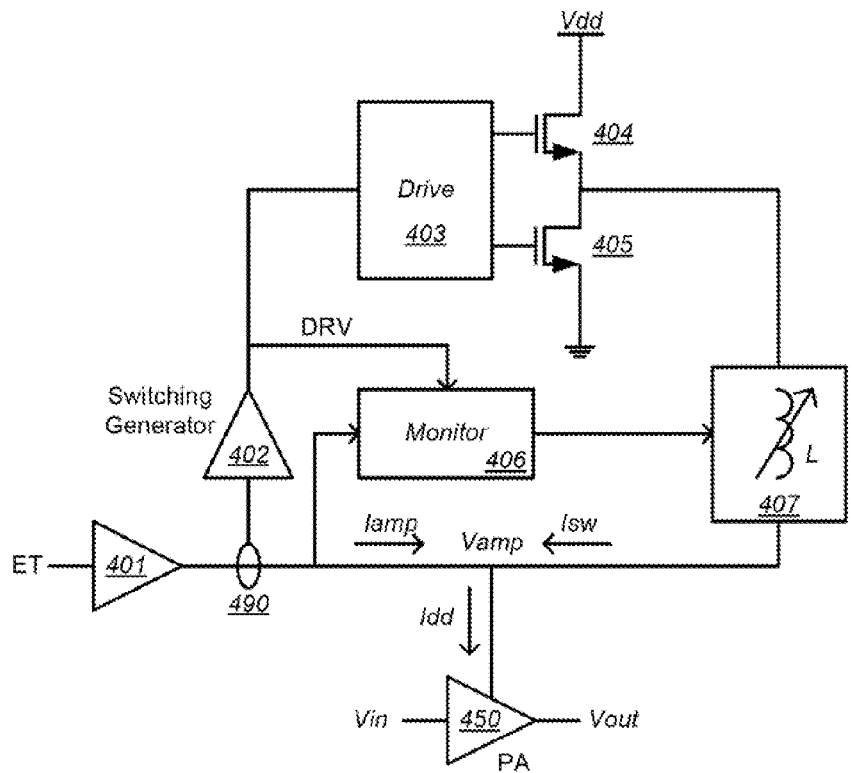
FIG. 4A illustrates an example circuit with reconfigurable inductance for envelope tracking according to another embodiment.

FIG. 4A illustrates an example circuit with reconfigurable inductance for envelope tracking according to another embodiment. A power amplifier 450 receives an input signal Vin and produces a power amplified output signal Vout. The PA 450 receives a power supply voltage Vamp and a supply current Idd from a linear amplifier and switching regulator. Linear amplifier 401 receives an envelope tracking signal ET based on an envelope of Vin, for example, and produces a voltage Vamp and a current Iamp. A sensor 490 senses Iamp and a switching generator 402 produces a switching signal DRV having a switching frequency. DRV is provided to drive circuitry 403 to turn switches 404 and 405 ON and OFF. A switching node between switches 404 and 405 is coupled to an input terminal of reconfigurable inductor 407. An output terminal of reconfigurable inductor 407 is coupled to the output of linear amplifier 401 to provide a current Isw from the switching stage. Currents Isw and Iamp are combined to provide Idd. For explanation purposes, operation of the linear amplifier and switching stage can be understood by assuming Vdd and Idd are constant. Iamp may initially be positive into PA 450. Sensor 490 detects the positive Iamp current, and switching generator 402 may cause switching signal DRV to go high. DRV high is passed through driver 403 to turn on switch 404 and turn off switch 405. Accordingly, Vdd is applied to an input terminal of reconfigurable inductance 407, which causes Isw to increase. When Isw increases above Idd, Iamp will go negative, which may be sensed at 490 and translated at 402 into DRV going low. DRV low turns off switch 404 and turns on switch 405, causing Isw to ramp down. The switching cycle is then repeated. Changes in the envelope signal ET and current drawn by PA 450 will cause the switching frequency of switching signal DRV to change, for example.

In one embodiment, switching signal DRV is received by a monitor circuit 406. Monitor circuit 406 may further receive information about the frequency of the envelope signal ET. In this example, monitor circuit 406 receives voltage signal Vamp at the envelope tracking frequency. As the envelope tracking signal frequency increases, the switching frequency of switching signal DRV will increase. However, the speed of the switching stage and the switching frequency of DRV may not be able to track the envelope tracking signal frequency at higher frequencies, where the envelope tracking frequency may meet or even exceed the switching frequency of switching signal DRV.

Advantageously, in this example monitor circuit 406 may compare a frequency of the envelope tracking signal ET (e.g., at Vamp) to the switching frequency of the switching signal DRV, and in accordance therewith, change the reconfigurable inductance. For example, monitor circuit 406 may have an output coupled to reconfigurable inductor 407 to send a signal (e.g., a logic signal) to change the inductance at the output of the switching stage. For example, at low ET frequencies, the switching frequency of the switching signal DRV may be greater than the frequency of Vamp. Accordingly, in this situation it may be desirable to have a larger inductance, and monitor circuit 406 may signal reconfigurable inductance 407 to have a higher inductance value. However, as the frequency of Vamp increases to the frequency of DRV, it may be desirable to have a lower inductance value. Accordingly, at higher Vamp frequencies monitor circuit 406 may signal reconfigurable inductance 407 to change the inductance to have a lower inductance value. In some embodiments, monitor circuit 406 may signal reconfigurable inductance 407 to alternately change between a plurality of discrete inductance values to produce an average inductance (e.g., when the frequency of the envelope tracking signal is less than the switching frequency of the switching signal). Accordingly, an average inductance may be decreased as the frequency of the envelope tracking signal increases, for example. This approach is illustrated by an example implementation below.

EXAMPLE

Figure 4B:
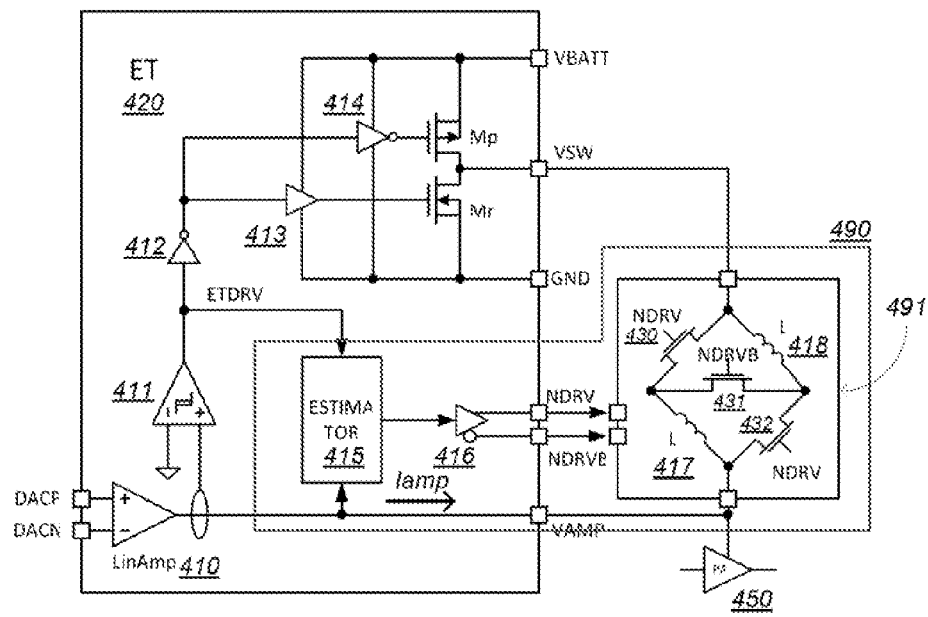
FIG. 4B illustrates an example circuit for generating an envelope tracking power supply to a power amplifier.

The following is a description of one example implementation of the techniques described above. FIG. 4B illustrates an example circuit for generating an envelope tracking power supply to a power amplifier. In this example, a linear amplifier (LinAmp) 410 receives an envelope tracking signal on differential inputs DACP and DACN, which may be outputs of a digital-to-analog converter, for example. LinAmp 410 generates an output voltage VAMP and output current Iamp. Iamp is sensed and provided to one input of a comparator 411 having hysteresis. Sensing may be implemented using a series sense resistor, for example, or other current sensing technique. Accordingly, when Iamp is positive and has a magnitude greater than a first hysteresis level, the comparator output, switching signal ETDRV, switches high. When Iamp is negative and has a magnitude less than a second hysteresis level, the comparator output, switching signal ETDRV, switches low. Switching signal ETDRV is coupled through inverters 412 and 414 to the gate of a PMOS transistor Mp, which acts as a high side switch. Similarly, switching signal ETDRV is coupled through inverter 412 and buffer 413 to the gate of a NMOS transistor Mn, which acts as a low side switch. High side switch may have a source terminal coupled to a power supply terminal, VBATT, which may be a battery, for example, and low side switch may have a source terminal coupled to ground. The drains of Mp and Mn are coupled together to form a switching node having a voltage VSW. The switching node is coupled to an input terminal of reconfigurable inductance 491. An output terminal of reconfigurable inductance 491 is coupled to the output of linear amplifier 410 and to a power supply terminal of a power amplifier 450.

In this example, monitor circuit is an estimator circuit 415, which compares a frequency of the envelope tracking signal VAMP to the switching frequency of the switching signal ETDRV, and in accordance therewith, changes the reconfigurable inductance 491 by alternating inductance configurations to produce an average inductance at the output of the switching stage. Thus, VAMP and ETDRV are coupled to inputs of estimator circuit 415. An example implementation of estimator circuit is illustrated below.

In this example, reconfigurable inductance 491 comprises two inductors 417 and 418 and three switches 430-432. Inductor 418 has a first terminal coupled to an input terminal of reconfigurable inductance 491 and a second terminal coupled to a terminal of switch 431 and a terminal of switch 432. Similarly, inductor 417 has a first terminal coupled to an output terminal of reconfigurable inductance 491 and a second terminal coupled to a terminal of switch 430 and the other terminal of switch 431. As shown in FIG. 4B, switch 430 has a first terminal coupled to the input of reconfigurable inductance 491, a second terminal coupled to the second terminal of inductor 417, and a control terminal coupled to a logic signal NDRV from estimator circuit 415. Switch 431 has a first terminal coupled to the second terminal of inductor 418, a second terminal coupled to the second terminal of inductor 417, and a control terminal coupled to a logic signal NDRVB from estimator circuit 415. Finally, switch 432 has a first terminal coupled to the output of reconfigurable inductance 491, a second terminal coupled to the second terminal of inductor 418, and a control terminal coupled to a logic signal NDRV from estimator circuit 415.

Figure 5A:
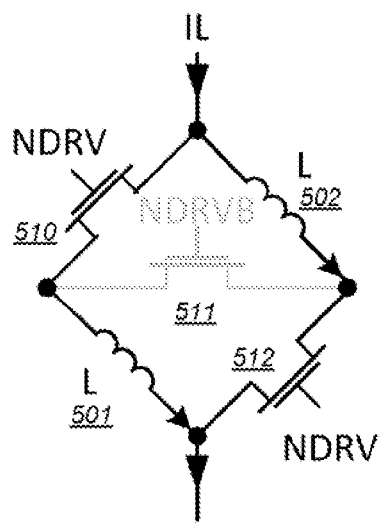
FIG. 5A shows an example reconfigurable inductance in a first state according to one embodiment.
Figure 5B:
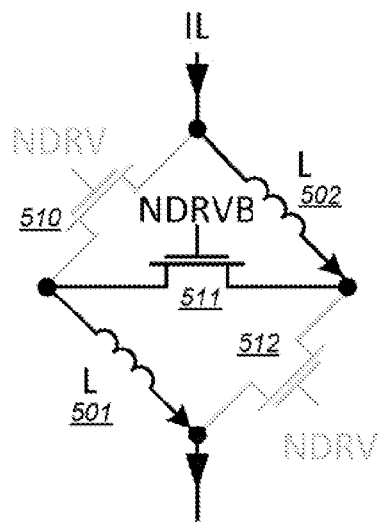
FIG. 5B shows an example reconfigurable inductance in a second state according to one embodiment.

Reconfigurable inductance 491 may be configured as shown in FIGS. 5A and 5B. In FIG. 5A, NDRV is high and switches 510 and 512 are closed, and NDRVB (NDRV bar, or the inverse of NDRV) is low and switch 511 is open. Accordingly, in this configuration, inductors 501 and 502 are in parallel. In FIG. 5B, NDRVB is high and switch 511 is closed, and NDRV is low and switches 510 and 512 are open. Accordingly, in this configuration, inductors 501 and 502 are in series. This is just one example of changing a reconfigurable inductance between a plurality of discrete inductance values using a plurality of switches and a plurality of inductors, which is one example means for reconfiguring inductance.

Figure 6:
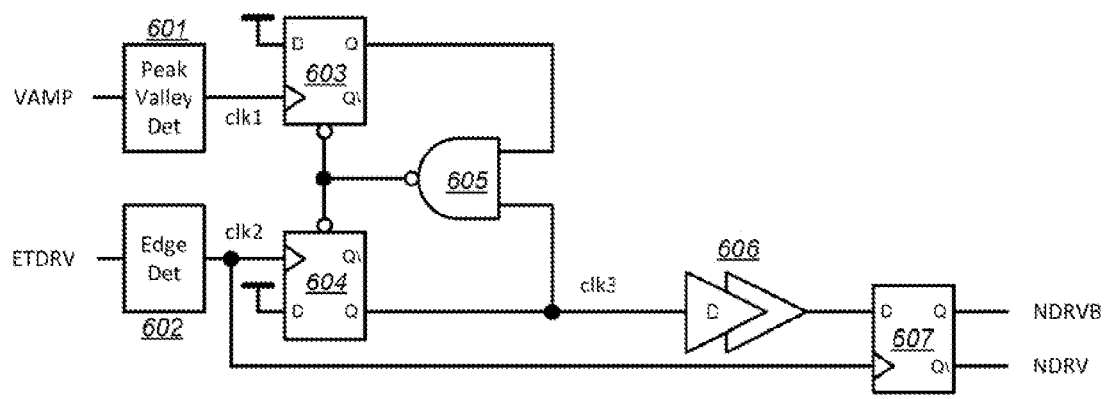
FIG. 6 illustrates an example estimator circuit according to one embodiment.

FIG. 6 illustrates an example estimator circuit according to one embodiment. The circuit in FIG. 6 is one example mechanism for comparing a frequency of the envelope tracking signal to the switching frequency of the switching signal to change inductance. In this example, the frequency of VAMP, which contains the frequency of the envelope tracking signal, is determined by detecting peaks and valleys in the waveform. Accordingly, VAMP is received by a peak/valley detector 601. In this example, peak/valley detector 601 generates a clock, clk1, that includes a pulse on each peak or valley detected by peak/valley detector 601. Switching signal ETDRV is receive by an edge detector 602 to generate a clock, clk2, that includes a pulse on each transition of the switching signal. D flip flops 603 and 604 form a frequency comparison circuit, where flip flop 604 generates a clock, clk3, that transitions high on clk2 and transitions low on clk1. Accordingly, clk3 is an example measure of a time difference between clk1 and clk2. NDRV and NDRVB are generated by another D-flip flop 607 that receives a version of clk3 delayed by delay circuit 606 on the D input and clk2 (the switching frequency) on the clock input.

Figure 7A:
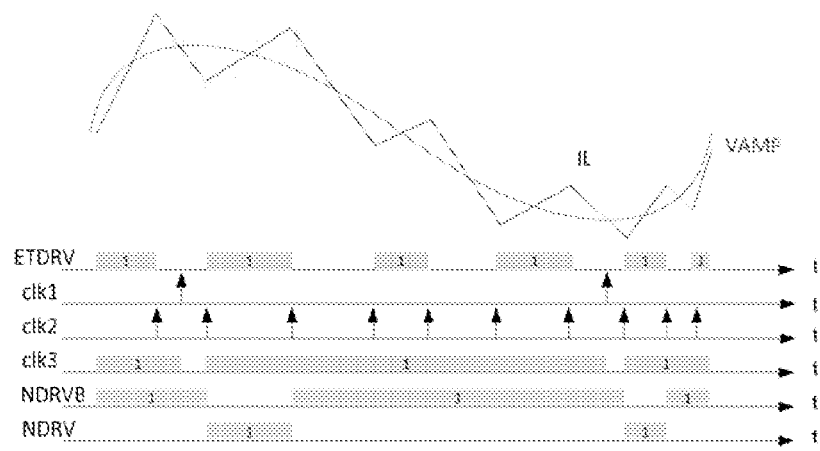
FIG. 7A illustrates example waveforms for an envelope tracking signal frequency below a switching frequency according to one embodiment.

FIG. 7A illustrates example waveforms for an envelope tracking signal frequency below a switching frequency according to one embodiment. In this figure, it can be seen that the frequency of the envelope tracking signal, embodied by VAMP, is lower than the switching frequency, embodied by the inductor current IL. Clock clk1 corresponds to peaks and valleys in the envelope tracking signal, and thus the frequency of that signal. Clock clk2 corresponds to ETDRV, the switching frequency. FIG. 7A shows that NDRV/NDRVB alternate (e.g., turn on and off) when the frequency of the envelope tracking signal is less than the switching frequency of the switching signal. The time NDRV is positive and the time NDRVB is positive correspond to the time the reconfigurable inductance is in different states. Because NDRV and NDRVB are alternating, an average inductance is produced at the output of the switching regulator. Furthermore, the average inductance may be decreased as the frequency of the envelope tracking signal increases. The circuit of FIG. 6 is one example mechanism for achieving this, as described in more detail below.

Advantages of switching between inductor configurations may include flux recycling to conserve energy during transitions. For example, referring to FIG. 5A-B, when inductors 510 and 511 are in series (FIG. 5B, large inductance state), a current IL flows through each inductor. However, when the inductors are configured in parallel (FIG. 5A, small inductance state), the instantaneous current in each inductor remains unchanged, and both inductors 510 and 511 continue to produce a current IL due to the flux in each inductor. This results in an increased output current of 2IL. Since the input current is IL, current in each inductor will ramp down to IL/2. Similarly, when the inductors are reconfigured from parallel to series, the instantaneous current in each inductor remains unchanged, and both inductors 510 and 511 continue to produce a current IL/2 due to the flux in each inductor, which results in a decreased output current of IL/2. Since the input current is IL, current in each inductor will ramp up to IL.

As mentioned above, clk3 is a measure of the frequency difference between clk1 (envelope frequency) and clk2 (switching frequency). Also, referring to FIG. 6, the clock input of flip flop 607 is clk2, which sets NDRV/NDRVB as clk3. Thus, when clk1 (envelop frequency) is much less than clk2 (switching frequency), the time NDRV is high will be smaller than the time NDRVB is high, and the average inductance will be larger. However, as the frequency of clk1 (envelope frequency) increases toward the frequency of clk2 (switching frequency), the time NDRV is high will increase and the time NDRVB is high will decrease. Accordingly, the average inductance decreases as the frequency of clk1 (switching frequency) increases.

Figure 7B:
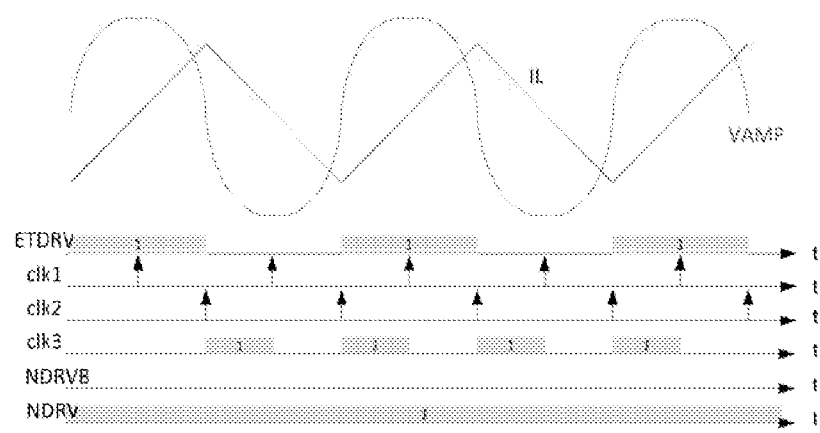
FIG. 7B illustrates example waveforms for a high frequency envelope tracking signal according to one embodiment.

FIG. 7B illustrates example waveforms for a high frequency envelope tracking signal according to one embodiment. In this case, the envelope signal frequency has increased to the switching frequency, and clk3 is high for a time period equal to the phase difference between clk1 and clk2. However, clk3 will now always be low on edges of clk2. Thus, clk3=0 will be clocked into D flip flop 607 and NDRVB remains low and NDRV remains high. In this case, the reconfigurable inductance remains in a low inductance configuration (e.g., inductors 417 and 418 remain in parallel).

Figure 8A:
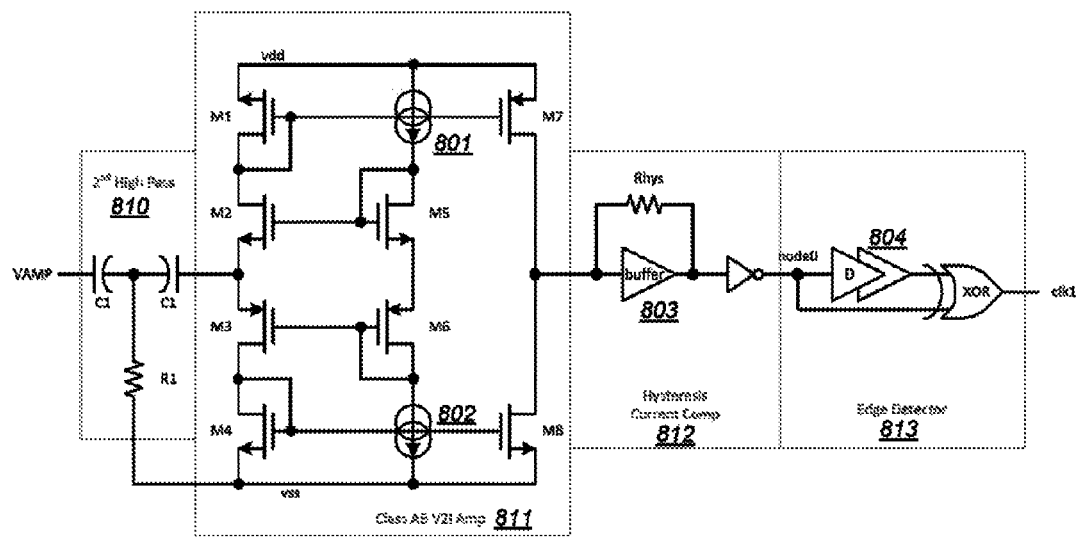
FIG. 8A illustrates an example peak/valley detector according to one embodiment.

FIG. 8A illustrates an example peak/valley detector according to one embodiment. In this example, a peak/valley detector includes a second order high pass filter 810, amplifier 811, hysteresis comparator 812, and edge detector 813. High pass filter 810 includes AC coupling capacitors C1/C1 and a resistor to ground R1. Amplifier 811 is a class AB voltage to current amplifier comprising a common gate input stage and current mirrors as illustrated by transistors M1-MM8 and current sources 801 and 802. Hysteresis comparator 812 comprises a buffer (e.g., series coupled inverters) and a feedback resistor, Rhys, to establish hysteresis. Edge detector 813 comprises a delay 804 (e.g., series coupled inverters) and an XOR gate to produce clk1, for example.

Figure 8B:
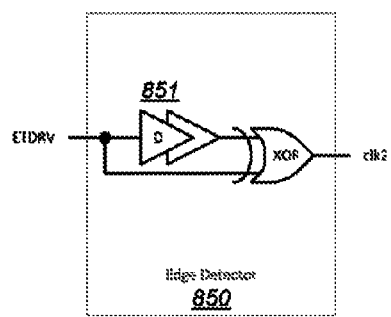
FIG. 8B illustrates an example edge detector according to one embodiment.

FIG. 8B illustrates an example edge detector according to one embodiment. Edge detector 850 receives switching signal ETDRV and may comprises a delay 851 and an XOR gate to produce clk2, for example.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A circuit comprising:
   a switching regulator, the switching regulator receiving a switching signal having a switching frequency;
   a monitor circuit configured to monitor the switching frequency; and
   a reconfigurable inductance coupled to an output of the switching regulator, wherein the monitor circuit is configured to change the reconfigurable inductance between a plurality of inductance values based at least on the switching frequency;
   an amplifier configured to receive an envelope tracking signal, wherein an output of the amplifier is coupled to an output of the switching regulator to provide a power supply voltage; and
   a switching generator circuit configured to produce the switching signal based on the envelope tracking signal, wherein the monitor circuit is further configured to compare a frequency of the envelope tracking signal to the switching frequency of the switching signal, and in accordance therewith, change the reconfigurable inductance.

2. The circuit of claim 1 wherein the reconfigurable inductance comprises a plurality of inductors and a plurality of switches.

3. The circuit of claim 1 wherein when the switching frequency is at a first frequency, the reconfigurable inductance has a first inductance value, and wherein when the switching frequency is at a second frequency greater than the first frequency, the reconfigurable inductance has a second inductance value less than the first inductance value.

4. The circuit of claim 1 wherein, in a first configuration, the reconfigurable inductance comprises a plurality of inductors in parallel, and wherein, in a second configuration, the reconfigurable inductance comprises said plurality of inductors in series.

5. The circuit of claim 4 wherein, in the first configuration, the reconfigurable inductance comprises two inductors in parallel, and wherein, in a second configuration, the reconfigurable inductance comprises said two inductors in series.

6. The circuit of claim 1 wherein an estimator circuit alternately changes the reconfigurable inductance between a plurality of discrete inductance values when the frequency of the envelope tracking signal is less than the switching frequency of the switching signal to produce an average inductance, and wherein the average inductance is decreased as the frequency of the envelope tracking signal increases.

7. The circuit of claim 6 wherein the estimator circuit comprises:
   a first detector circuit to produce a first clock signal based on a time difference between peaks in the envelope tracking signal and valleys in the envelope tracking signal;
   a second detector circuit to produce a second clock signal based on edges of the switching signal; and
   a frequency comparison circuit to compare a frequency of the first clock signal to the frequency of the second clock signal, and in accordance therewith, produce a logic signal to change the reconfigurable inductance.

8. A method comprising:
   receiving a switching signal having a switching frequency by a switching regulator;
   monitoring the switching frequency;
   reconfiguring an inductance coupled to an output of the switching regulator between a plurality of inductance values based at least on the switching frequency;
   receiving an envelope tracking signal at an input of an amplifier, wherein an output of the amplifier is coupled to an output of the switching regulator to provide a power supply voltage;
   generating the switching signal based on the envelope tracking signal; and
   comparing a frequency of the envelope tracking signal to the switching frequency of the switching signal, and in accordance therewith, changing the inductance.

9. The method of claim 8 wherein the inductance is reduced as the switching frequency increases.

10. The method of claim 8 wherein reconfiguring the inductance comprises alternately changing the inductance between a plurality of discrete inductance values to produce an average inductance.

11. The method of claim 8 wherein the inductance comprises a plurality of inductors coupled together by a plurality of switches, and wherein reconfiguring the inductance comprises turning on one or more switches and turning off one or more other switches.

12. The method of claim 8 wherein, in a first configuration, the inductance comprises a plurality of inductors configured in parallel, and wherein, in a second configuration, the inductance comprises said plurality of inductors configured in series.

13. The method of claim 12 wherein, in the first configuration, the reconfigurable inductance comprises two inductors in parallel, and wherein, in a second configuration, the reconfigurable inductance comprises said two inductors in series.

14. The method of claim 8 further comprising:
   detecting a time difference between peaks in the envelope tracking signal and valleys in the envelope tracking signal to produce a first clock signal;
   detecting edges of the switching signal to produce a second clock signal; and
   comparing a frequency of the first clock signal to a frequency of the second clock signal, and in accordance therewith, producing a signal to reconfigure the inductance.

15. A circuit comprising:
   a switching regulator, the switching regulator receiving a switching signal having a switching frequency;
   a reconfigurable inductance coupled to the output of the switching regulator;
   means for monitoring the switching frequency and changing the reconfigurable inductance between a plurality of inductance values based at least on the switching frequency;
   an amplifier to receive an envelope tracking signal, wherein an output of the amplifier is coupled to an output of the switching regulator to provide a power supply voltage;
   means for generating the switching signal based on the envelope tracking signal; and
   means for comparing a frequency of the envelope tracking signal to the switching frequency of the switching signal, and in accordance therewith, changing the reconfigurable inductance.

16. The circuit of claim 15 wherein the inductance is reduced as the switching frequency increases.

17. The circuit of claim 15 wherein, in a first configuration, the reconfigurable inductance means comprises a plurality of inductors in parallel, and wherein, in a second configuration, the reconfigurable inductance means comprises said plurality of inductors in series.

* * * * *